United States Patent [19]

Smith

[11] 3,999,132
[45] Dec. 21, 1976

[54] STEREO INHIBIT CIRCUIT
[75] Inventor: Paul Lee Smith, Hanover Park, Ill.
[73] Assignee: Motorola, Inc., Schaumburg, Ill.
[22] Filed: Oct. 31, 1975
[21] Appl. No.: 627,586
[52] U.S. Cl. .................................. 325/455; 325/36; 325/348; 325/478; 179/15 BT
[51] Int. Cl.² .......................................... H04B 1/06
[58] Field of Search .... 325/36, 348, 398, 455–457, 325/473, 474, 478; 179/15 BT

[56] References Cited
UNITED STATES PATENTS

| 3,125,640 | 3/1964 | Von Recklinghausen | 325/455 |
|---|---|---|---|
| 3,264,414 | 8/1966 | Santilli | 179/15 BT |
| 3,569,633 | 3/1971 | Brahman | 325/348 |
| 3,790,714 | 2/1974 | Ohsawa | 179/15 BT |
| 3,919,482 | 11/1975 | Hamada | 325/478 |

Primary Examiner—Robert L. Griffin
Assistant Examiner—Jin F. Ng
Attorney, Agent, or Firm—James W. Gillman; Donald J. Lisa; Phillip H. Melamed

[57] ABSTRACT

A stereo inhibit circuit adaptable for use in an FM stereo radio having a stereo indicating light is disclosed. A level detector and a mute circuit develop a mute signal which is related to the amount of signal noise at the output of an FM detector. This mute signal is used to inhibit a stereo switch that controls the stereo indicating light while permitting the creation of audible signals by a stereo demodulator and a pair of speakers. Thus the stereo inhibit circuit permits the creation of an audible hiss and positively prevents any flickering of the stereo indicating light when the FM radio is not tuned to a station.

9 Claims, 1 Drawing Figure

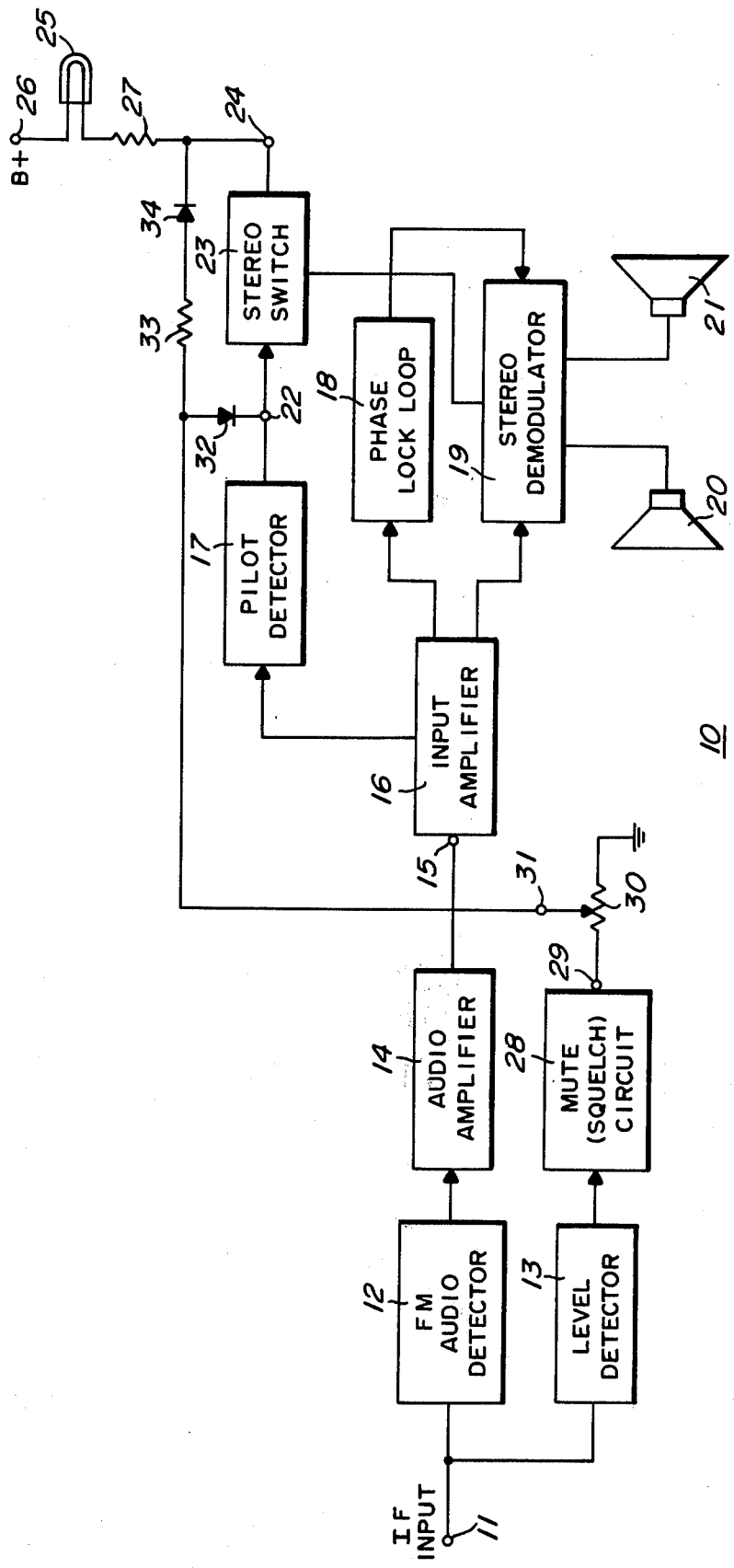

STEREO INHIBIT CIRCUIT

BACKGROUND OF THE INVENTION

The present invention relates generally to the field of inhibit circuits for radios and more particularly to noise sensitive inhibiting circuits for FM stereo radios having a stereo indicating light.

Most FM (frequency modulated) stereo radios produce an audible noise hiss whenever the radio is not tuned to a transmitting FM channel frequency. The stereo indicating light is normally controlled by a stereo pilot detector which detects the presence of a 19kHz pilot (carrier) signal in the output signal of an FM detector. When the radio is not tuned to a station, the output of the FM detector is band limited noise. This noise results in an audible hiss at the speakers, but also can cause the pilot detector to falsely indicate the presence of the 19kHz carrier signal. This can therefore result in the flickering on and off of the stereo indicating light whenever the radio is not tuned to a station, thus annoying and misleading a person who is trying to tune the radio to a stereo station.

In some radio receivers, a mute signal is developed which is proportional to the magnitude of the IF (intermediate frequency) signal received by the FM detector. This mute signal is then used to inhibit (squelch) the output of the FM detector. This results in the positive inhibiting of the stereo indicating light as well as the total quieting of the radio speakers. In many applications, such as for FM stereo radios used in automobiles, such a result is not desirable since there is no audible indication given to the driver of the vehicle which alerts him to the fact that his radio is on. Thus these prior systems do not provide any audible indication that the radio is on whenever the stereo indicating light is inhibited because no FM signal is currently being received. Therefore the driver may falsely believe that his radio is inoperative (broken) or inadvertently leave his radio on and unnecessarily drain power from the electrical system of his car.

SUMMARY OF THE INVENTION

An object of the present invention is to provide an improved stereo inhibit circuit which overcomes all of the aforementioned deficiencies.

A more particular object of the invention is to provide an improved stereo inhibit circuit for positively muting a visual indicator of a pilot signal in the presence of an excessive amount of noise while providing an audible alert signal.

In one embodiment of the present invention there is provided an improved stereo inhibit circuit adaptable for use with FM stereo decoders in a radio having a stereo indicating light. The inhibit circuit comprises: a demodulator circuit means for receiving modulated input signals and producing output signals corresponding to the modulation of the input signals; decoder means coupled to the demodulator means for receiving the output signals and including, means for detecting the presence of a pilot signal in said output signals and producing an electrical detect signal in response thereto, switch means for receiving said electrical detect signal and producing a visual indication of the presence of a pilot signal in response thereto, and means for producing audible signals; means adaptable for operation in association with the demodulator circuit means for producing a mute signal related to the amount of signal noise contained in the output signals; and inhibiting means, coupled between the mute signal producing means and the decoder means, for preventing the switch means from responding to said electrical signal while permitting the creation of audible signals in response to the noise in the output signals exceeding a predetermined level, whereby the visual indication is positively muted for an excess amount of noise while an audible signal is provided to assure a listener that the radio is still operative.

Basically, the present invention concerns a muting of only the visual stereo indicating light while permitting an audible hiss to occur at the speaker whenever the radio is not tuned to a station.

BRIEF DESCRIPTION OF THE DRAWINGS

For a more complete understanding of the invention reference should be made to the drawing, which is a block diagram of a radio receiver circuit which embodies the present invention.

DESCRIPTION OF THE PREFERRED EMBODIMENT

Referring to the drawing, a circuit 10 for use in an FM stereo receiver is illustrated. An IF input terminal 11 is coupled to an FM audio detector 12 and a level detector 13 and receives FM input signals from a prior IF stage (not shown). The detector 12 receives these modulated input signals from the terminal 11, demodulates these signals and produces audio output signals corresponding to the modulation of the input signals. These audio signals are coupled to an audio amplifier 14 which amplifies them and couples them to an input terminal 15 of an output buffer amplifier 16.

The amplifier 16 supplies amplified signals to a pilot detector 17, a phase locked loop 18, and a stereo demodulator 19. The phase locked loop generates a 38kHz signal which is in phase with any 19kHz pilot signal contained in the signals received by the phase locked loop from the input amplifier 16. The stereo demodulator 19 receives amplified signals from the amplifier 16 and a 38kHz signal from the phase locked loop 18 and produces a left channel audio signal coupled to a speaker 20 and a right channel audio signal coupled to a speaker 21. The pilot detector 17 receives amplified signals from the amplifier 16 and produces a DC output signal at a terminal 22 which is coupled to a stereo switch 23. This DC output signal has a low magnitude if a 19kHz pilot signal is present in the signals received by the amplifier 16 and a high magnitude if no such pilot signal is present.

The stereo switch 23 provides a low voltage to an output terminal 24 when it receives a low voltage from the pilot detector 17. The stereo switch 23 is also coupled to the stereo demodulator 19. When the pilot detector 17 detects the presence of a pilot signal in the signals received by the amplifier 15, the stereo switch 23 will produce a low voltage at the terminal 24 and also produce an enable signal that is coupled to the stereo demodulator 19 which indicates that a stereo FM signal is being received by the radio. This signal enables the stereo demodulator which results in the stereo signal being separated into left and right audio signals. When no pilot carrier is present in the signals at terminal 15, the pilot detector 17 produces a high DC voltage which is coupled to the stereo switch 23. This results in a high voltage at the terminal 24 and the disabling of the stereo demodulator. When the demodulator is disabled, it no longer separates the audio signal received from the input amplifier 16 into separate left and right audio channels and merely presents identical audio signals to both the left and right channels.

The internal construction of the components 16 through 19 and the stereo switch 23 are not described in detail in this specification since their construction is readily understood by those skilled in the art and since these components are commonly available. In a preferred embodiment of the present invention, the components 16 through 19 and the stereo switch 23 are all contained in a single linear integrated circuit which is commonly referred to as an RC phase locked loop stereo decoder and is available from the RCA Corporation (CA758E).

A stereo indicating light 25 has one of its terminals directly connected to a B+ terminal 26 and the other of its terminals connected to the terminal 24 through a resistor 27. The stereo light 25 provides a visual indication when the pilot detector 17 determines that the signals at the terminal 15 contain a 19kHz pilot carrier signal.

The level detector 13 receives the modulated IF carrier signal from the terminal 11 and produces an output signal related to the amount of noise present in the IF carrier. The detector 13 can either directly sense the noise present in the IF signal or, if the IF signal has not been limited yet, it can sense the magnitude of the IF signal. The output signal is then coupled to a mute (squelch) circuit 28 which produces a DC mute signal at a terminal 29. This mute signal varies continuously from 4 volts, when a noisy IF signal is detected by the level detector 13, to zero volts, when a strong noise free IF signal is detected. Terminal 29 is connected to ground through the resistive element of a potentiometer 30 having an adjustable center tap terminal 31. An adjustable voltage, related to the magnitude of the mute signal at terminal 29, is provided at the terminal 31 and is coupled to the terminal 22 through a diode 32 having its anode connected to the terminal 31 and its cathode connected to the terminal 22. The terminal 31 is also coupled to the terminal 24 through a resistor 33 in series with a diode 34 having its cathode directly connected to the terminal 24.

The specific construction of the FM detector 12, the level detector 13, the audio amplifier 14 and the mute (squelch) circuit 28 have not been described in detail in the specification since their construction is readily apparent to persons of ordinary skill in the art and these components are readily available. In a preferred embodiment of the present invention, the components 12 through 14 and 28 are contained on a single linear integrated circuit manufactured by the RCA Company (CA3089E).

The function of the level detector 13 and the mute circuit 28 is to produce a mute signal at the terminal 29 which is related to either the amount of noise or the strength of the IF signal present at the terminal 11. Therefore this signal is also related to the noise contained in the output signals produced by the audio amplifier 14.

If no IF signal is present, the entire output of the audio amplifier 14 is noise and a 4 volt signal is present at the terminal 29. This signal results in a high voltage being present at the terminal 31. This voltage results in raising the voltage at the terminal 22 and maintaining it at a high voltage level through the action of diode 32 so that the stereo switch 23 is kept off and cannot be actuated by the pilot detect signal created by the detector 17. Thus the flickering of the stereo indicating light 25, which would normally be caused by the erratic response of the pilot detector 17 to a noisy input signal, is eliminated by an inhibiting means (comprising the potentiometer 30 and the diode 32) which is coupled between a mute signal producing means (comprising the level detector 13 and the mute circuit 28) and the stereo switch 23. In addition, the noise present at the terminal 15 is passed through the amplifier 16 and the demodulator 19 to the speakers 20 and 21 resulting in an audible hiss.

When a strong IF signal is present at the terminal 11, only a small amount of noise exists at terminal 15 and a 1 volt muting signal is present at the terminal 29. This results in the reverse biasing of the diode 32 which enables the pilot detector 17 to once again control the operation of the stereo switch 23. Whenever a pilot signal is not received by the input terminal 15, the pilot detector 17 produces a high output signal at the terminal 22 which results in the stereo switch 23 keeping the indicating light 25 off. When a pilot carrier signal is present at the terminal 15, the pilot detector 17 will produce a low voltage at the terminal 22 which results in the stereo switch 23 turning on the indicating light 25 by producing a low voltage at the terminal 24.

Whenever terminal 24 is held at a low voltage (typically 1.5 volts) by the switch 23, a high voltage at the terminal 31 will result in the forward biasing of the diode 34 and the drawing of current by the components 33 and 34. The net effect of this is to require a higher mute signal at the terminal 29, whenever the lamp 25 is conducting, in order to produce a large enough voltage at the terminal 31 which will result in the shutting off of the stereo switch 23. Thus the resistor 33 and the diode 34 comprise a means for increasing the magnitude of the signal at the terminal 29 which is required in order to result in the inhibiting of the stereo light 25. Thus minor fluctuations in the IF signal strength which occur after a pilot carrier has been detected and the indicating light turned on, will not result in any flickering of the stereo indicating light.

While the present invention illustrates a level detector 13 which senses the noise in the IF signal at the terminal 11 and thereby creates a mute signal at the terminal 29 which is related to the noise at the terminal 15, the present invention is not limited to such a configuration. Any noise detecting circuitry can be used in place of the level detector 13 and the mute circuit 28 in order to produce a signal at the terminal 29 which is related to the noise at the terminal 15. In addition, the present invention is not limited to the use of the noise present at the terminal 15 to create an audible signal at the speakers 20 and 21 whenever an IF signal is not present at the terminal 11.

The present invention has provided a novel circuit for inhibiting the production of a visual stereo indication while creating an audible signal in response to the noise from an FM demodulator exceeding a predetermined level. While I have shown and described specific embodiments of this invention, further modifications and improvements will occur to those skilled in the art. All such modifications which retain the basic underlying principles disclosed and claimed herein are within the scope of this invention.

I claim:

1. An improved stereo inhibit circuit adaptable for use with FM stereo decoders in a radio having a stereo indicating light; the circuit comprising:

a demodulator circuit means for receiving modulated input signals and producing output signals corresponding to the modulation of said input signals;

decoder means coupled to said demodulator means for receiving said output signals and including, means for detecting the presence of a pilot signal in said output signals and producing an electrical detect signal in response thereto, switch means, including indicator means, coupled to said detecting means for receiving said electrical detect signal for producing a visual indication of the presence of a pilot signal in response thereto, and means for producing audible signals in response to said output signals;

means coupled to said demodulator circuit means for producing a mute signal related to the amount of signal noise contained in said output signals; and inhibiting means, coupled between said mute signal producing means and said switch means, for preventing said switch means from responding to said electrical detect signal and permitting the creation of said audible signals in response to the amount of the noise in said output signals exceeding a predetermined level, whereby the visual indication is positively muted for an excessive amount of noise while an audible signal is provided to assure a listener that the radio is still operative.

2. An improved stereo inhibit circuit according to claim 1 wherein said demodulator circuit means includes a frequency demodulator circuit.

3. An improved stereo inhibit circuit according to claim 2 wherein said decoder means includes means for producing separate electrical signals from said output signals and coupling these electrical signals to separate speakers.

4. An improved stereo inhibit circuit according to claim 1 wherein said mute signal producing means includes a level detector means for producing a signal related to the magnitude of said input signals.

5. An improved stereo inhibit circuit according to claim 4 wherein said indicator means includes a stereo indicating light, and said switch means is coupled to said pilot detector means for supplying power to said light in response to said electrical detect signal.

6. An improved stereo inhibit circuit according to claim 5 wherein said inhibiting means includes a diode coupled between said mute signal producing means and said switch means, whereby the diode prevents small mute signals from affecting said switch means.

7. An improved stereo inhibit circuit according to claim 6 wherein said inhibiting means includes a potentiometer for adjusting the amount of signal coupled through said diode.

8. An improves stereo inhibit circuit according to claim 7 wherein said decoder means includes a stereo demodulator and said demodulator means includes an FM demodulator.

9. An improved stereo inhibit circuit adaptable for use with FM stereo decoders in a radio having a stereo indicating light; the circuit comprising:

a demodulator circuit means for receiving modulated input signals and producing output signals corresponding to the modulation of said input signals;

decoder means coupled to said demodulator means for receiving said output signals and including means for producing a visual indication of the presence of a pilot signal in said output signals and means for producing audible signals in response to said output signals;

means coupled to said demodulator circuit means for producing a mute signal related to the amount of signal noise contained in said output signals;

means coupled between said mute signal producing means and said visual indication means of said decoder means, for receiving said mute signal and inhibiting production of said visual indication and permitting the creation of said audible signals in response to said mute signal exceeding a predetermined magnitude whereby the visual indication is positively muted for an excessive amount of noise while an audible signal is provided to assure a listener that the radio is still operative; and means coupled to said decoder means and said inhibiting means for increasing said predetermined magnitude in response to the production of said visual indication, whereby small amounts of noise are prevented from inhibiting the production of the visual indication while the indication is being given.

* * * * *